United States Patent
Gill et al.

[11] Patent Number: 5,537,362
[45] Date of Patent: Jul. 16, 1996

[54] LOW-VOLTAGE EEPROM USING CHARGE-PUMPED WORD LINES

[75] Inventors: Manzur Gill, Saratoga; Vincent Fong, Fremont, both of Calif.

[73] Assignee: National Semiconductor Corporation, Santa Clara, Calif.

[21] Appl. No.: 349,930

[22] Filed: Dec. 6, 1994

[51] Int. Cl.$^6$ .................................................. G11C 8/00
[52] U.S. Cl. .................. 365/233.5; 365/230.06; 365/189.11
[58] Field of Search .............. 365/233.5, 230.06, 365/189.09, 203, 185.23, 189.11; 327/536

[56] References Cited

U.S. PATENT DOCUMENTS

| | | | |
|---|---|---|---|
| 4,667,312 | 5/1987 | Doung et al. | 365/203 |
| 4,823,317 | 4/1989 | Brahmbhatt | 365/189.08 |
| 5,025,422 | 6/1991 | Moriwaki et al. | 365/233.5 |
| 5,400,279 | 3/1995 | Momodomi et al. | 365/230.06 X |

OTHER PUBLICATIONS

Kuniyoshi Yoshikawa et al., "Comparison of Current Flash EEPROM Erasing Methods: Stability and How to control", 1992, pp. 595–598, IEDM Technical Digest.

K. Oyama et al., "A Novel Erasing Technology for 3.3V Flash Memory with 64Mb Capacity and Beyond", 1992, pp. 607–610, IEDM Technical Digest.

Seiji Yamada et al., "A Self–Convergence Erasing Scheme For a Simple Stacked Gate Flash EEPROM", 1991, pp. 307–310, IEDM Technical Digest.

*Primary Examiner*—Joseph A. Popek
*Attorney, Agent, or Firm*—Limbach & Limbach

[57] ABSTRACT

A Low-voltage Electrically Erasable, Electrically Programmable Read Only Memory (EEPROM) and a method for reading memory cells in the EEPROM. During a read operation address input is provided to an address latch and edge detector, which supplies a changed address signal to a charge-sharing word line voltage generator, supplies word line address signals to a word line address decoder, and supplies bit line address signals to a bit line address decoder and sense amplifier circuit. The word line address decoder provides a positive voltage from a positive voltage source to a selected word line in the memory array and provides a voltage that is negative with respect to ground to deselected word lines. The bit line address decoder and sense amplifier circuit grounds selected source bit lines and senses drain to source current to read the memory cells. The charge-sharing word line voltage generator and charge-sharing bit line voltage generator use a plurality of charge pump circuits and capacitors to store and share charge with the word lines. The EEPROM has a reduced erased voltage threshold range by extending the erase time during erase operations.

30 Claims, 5 Drawing Sheets

LOW-VOLTAGE EEPROM USING CHARGE-PUMPED WORD LINES

RELATED APPLICATION

This application discloses subject matter also disclosed in co-pending U.S. patent application entitled APPARATUS AND METHOD FOR REDUCING ERASED THRESHOLD VOLTAGE DISTRIBUTION IN FLASH MEMORY ARRAYS, U.S. patent application Ser. No. 08/349,812 filed on even date herewith which is also assigned to National Semiconductor Corporation, which foregoing application is hereby incorporated by reference.

BACKGROUND OF THE INVENTION

1. Field of the Invention

The present invention relates to Electrically-Erasable, Programmable Read Only Memories (EEPROMs), and more particularly, but not by way of limitation, to a low-voltage EEPROM and a method for reading the same.

2. Discussion

Electrically-Erasable, Electrically Programmable Read Only Memories (EEPROMs), including Flash EEPROMs, commonly contain an array of memory cells that can be programmed and erased in-circuit. The memory cells are formed from semiconductor field effect transistors with floating gate structures. During programming, the memory cell floating gates are selectively charged to store data. To read a memory cell, a sense voltage is applied to the memory cell control gate and a read voltage is applied across the drain to source region. The drain to source current is then sensed by sense and decoding circuitry.

An important characteristic of memory cell transistors with floating gate structures is voltage threshold $V_t$, which is the minimum voltage than can be applied to a memory cell gate (with respect to the source—$V_{GS}$) to "turn on", or saturate, the memory cell and allow current to flow between the memory cell source and drain. The voltage threshold of a memory cell with an uncharged floating gate is generally much lower than the voltage threshold of that same memory cell with a charged floating gate.

The voltage thresholds of typical EEPROM memory cells in a memory array with uncharged, or erased, floating gates are not uniform, but typically range from about 1.5 V to about 3.5 V. The same EEPROM memory cells with programmed floating gates will typically have a threshold voltage range from about 5.5 V to about 7.0 V.

EEPROMs take advantage of the change in memory cell voltage threshold between erased and programmed states. During a read operation, a typical EEPROM provides a voltage $V_{GS}$ that is greater than the erased voltage threshold range and less than the programmed voltage threshold range; in other words between about 3.5 V and about 5.5 V. The voltage $V_{GS}$ is sufficient to turn on the memory cell when the floating gate is erased, but insufficient to turn on the memory cell when the floating gate is programmed. The presence of current flow from the memory cell drain to source indicates the memory cell is erased; the absence of current from drain to source indicates the memory cell is programmed.

It is important that the read voltage margin between erased and programmed voltage threshold ranges be maintained to ensure reliable read operations. If the erased and programmed voltage threshold ranges increase, the read voltage margin is decreased and the EEPROM may provide false data during read operations. EEPROM threshold voltage ranges can be difficult to control. Factors such as manufacturing variation, operating temperature, and the number of erase cycles can contribute to variations in these threshold voltage ranges.

In addition, power supply voltage can influence EEPROM read operations. Typically EEPROMs use a source voltage $V_{cc}$ of about 5 V, and can generally operate with power supplies providing between 4.5 V and 6 V. To read a memory cell, these EEPROMs generally apply the source voltage $V_{cc}$ to the memory cell gate and ground the memory cell source to achieve a $V_{GS}$ of about 5 V. This $V_{GS}$ voltage of about 5 V generally falls within the read voltage margin and allows reliable reading of memory cells in the array. Fluctuations in source voltage, however, may provide a $V_{GS}$ that does not fall within the read voltage margin, leading to problems during read operations.

There is an industry trend to reduce the source voltage $V_{cc}$ in modern electronic applications. Reducing the source voltage $V_{cc}$ reduces battery size and power requirements and lengthens battery life, enabling the development of smaller and longer lasting applications, especially in the areas of portable electronic devices. Modern microprocessors are presently being developed that use a source voltage $V_{cc}$ of 3.3 V. A source voltage of about 3 V, however, may generally not provide a sufficient gate voltage $V_{GS}$ to reliably read memory cells in typical EEPROMs.

One way to use a reduced source voltage of about 3 V with an EEPROM is to use conventional charge pump techniques to increase the source voltage from about 3 V to about 5 V, and apply the 5 V to the gate during a read operation. An advantage of this approach is that it allows the use of existing EEPROM memory arrays; a disadvantage of this approach, however, it that conventional charge pump techniques require a significant amount of time to increase a voltage from 3 V to 5 V. EEPROMs that use charge pump techniques to increase a source voltage $V_{cc}$ of about 3 V to about 5 V are generally slower, in terms of access time during read operations, than typical EEPROMs that use a source voltage $V_{cc}$ of about 5 V.

There are advantages to be gained if a lower source voltage $V_{cc}$ could be used with 5 EEPROM memory cells. One such advantage relates to reduced erased voltage threshold values and a reduction in the variation of the erased voltage threshold.

Electrically, a memory cell floating gate is a capacitor. As the charge is removed from a programmed floating gate during an erase operation, the threshold voltage on the floating gate decays in an exponential manner from an initial programmed voltage to a final erased voltage. Variations in the final erased voltage contribute to variations in the erased voltage threshold range.

FIG. 1 shows a graphical representation of the voltage threshold range of typical programmed memory cells as the memory cells are erased over time. The y-axis is memory cell voltage threshold $V_t$ and the x-axis is time. The top curve represents the maximum voltage threshold of memory cells during erasure and the bottom curve represents the minimum voltage threshold of memory cells during erasure. Thus, the area bounded by the two curves represents the voltage threshold range $V_t$ of typical memory cells during an erase operation. As can be seen, the two curves eventually converge.

At time $t_0$, when the erase operation begins, programmed memory cells have a voltage threshold $V_t$ of from about 5.5 V to about 7.0 V.

At time $t_1$, the voltage thresholds of the memory cells decrease to from about 1.5 V to about 3.5 V. At this point, the difference between the maximum and the minimum voltage thresholds, designated as $\Delta 1$, is about 2 V. These values correspond to the typical voltage threshold range of erased memory cells. In other words, EEPROMs typically erase programmed memory cells for a duration of time about equal to the time period $t_1$ to achieve an erased voltage threshold $V_t$ of about 1.5 V to about 3.5 V. The time period $t_1$ is typically about 100 ms.

If memory cells continue to be erased beyond time $t_1$, the voltage thresholds continue to decrease. A time $t_2$, which is a time greater than $t_1$, the voltage thresholds of the memory cells decrease from about 0 V to about 1.5 V. At this point, the difference between the maximum and the minimum voltage thresholds, designated as $\Delta 2$, is about 1.5 V. Thus, at time $t_2$, both the maximum erased voltage threshold and the variation in the erased voltage threshold range have been significantly reduced.

There are problems, however, associated with erasing memory cells for a period of time equal to $t_2$. It may not always be feasible to erase memory cells for a time period $t_2$, although various techniques might be employed to decrease the time period $t_2$, such as using a higher erase voltage during the erase operation. One particularly useful method for reducing the erased voltage threshold is provided in the previously referenced U.S. patent application Ser. No. 08/349,812 entitled APPARATUS AND METHOD FOR REDUCING ERASED THRESHOLD VOLTAGE DISTRIBUTION IN FLASH MEMORY ARRAYS.

A greater problem exists, however, in reducing the minimum erased voltage threshold to a value close to, or even less than 0 V, namely, the risk of unintentionally turning on deselected memory cells during a read operation on selected memory cells in a memory array, potentially resulting in false date during the read operation. This could occur because memory cells are commonly deselected by applying 0 V (ground) to the memory cell gates. This resulting in a $V_{GS}$ of about 0 V, which is sufficient to turn on the deselected memory cells if the erased voltage threshold is also about 0 V.

There is a need, therefore, for a low voltage EEPROM with a conventional memory array that uses a source voltage less than 5 V, reduces power requirements, provides read access times comparable to standard 5 V EEPROMs, and reliably uses a lower erased voltage threshold.

SUMMARY OF THE INVENTION

The present invention provides a low voltage Electrically-Erasable, Electrically Programmable Read Only Memory (EEPROM) and a method for reading memory cells in a low voltage EEPROM using an increased voltage range.

The EEPROM of the present invention uses voltage sources, either external or on the EEPROM, to provide an increased range of voltages to the EEPROM memory array during a read operation. As with standard EEPROMs, the gates of the memory cells in the EEPROM memory array are accessible by way of word lines, and the sources and drains of the memory cells in the array are accessible by way of bit lines. Unlike standard EEPROMs, however, the EEPROM of the present invention uses extended erase time techniques and/or increased erase voltages to provide an erased voltage threshold range of from about 0 V to about 1.5 V. To read an EEPROM memory cell, the EEPROM provides a positive voltage, perhaps the source voltage $V_{cc}$, to a selected word line, and a negative voltage to deselected word lines. The positive voltage applied to the memory cell gate by way of the selected word line provides a gate voltage $V_{GS}$ that is sufficiently greater than the memory cell voltage threshold range to reliably turn on a memory cell with an erased floating gate. The word line voltage provided to the deselected word lines provides a negative gate voltage $V_{GS}$, ensuring memory cells in deselected word lines do not turn on during the read operation.

In a preferred embodiment, the positive voltage applied to the selected word line is a source voltage $V_{cc}$ of about 3 V and the negative voltage, applied to the deselected word lines, is generated on chip and is about $-2$ V.

To achieve access times comparable to standard 5 EEPROMs, the EEPROM voltage source uses a charge-sharing technique to store and transfer sufficient negative charge to supply the necessary negative voltage to the deselected word lines.

An object of the present invention is to provide an EEPROM which operates with a source voltage $V_{cc}$ below 5 V while using conventional memory arrays.

Another object of the present invention, while achieving the above stated object, is to provide an EEPROM that takes advantage of an erased voltage threshold range of memory cells.

Still another object of the present invention, while achieving the above stated objects, is to provide an EEPROM which applies a voltage, negative with respect to ground, to the deselected word lines to maintain $V_{GS}$ greater than the erased voltage threshold range.

Still another object of the present invention, while achieving the above stated objects, is to provide a low-voltage EEPROM with charge-sharing capabilities to achieve fast read access times.

Other objects, features, and advantages of the present invention will become apparent from the following detailed description when read together with the drawings and appended claims.

DETAILED DESCRIPTION

Figure 2:
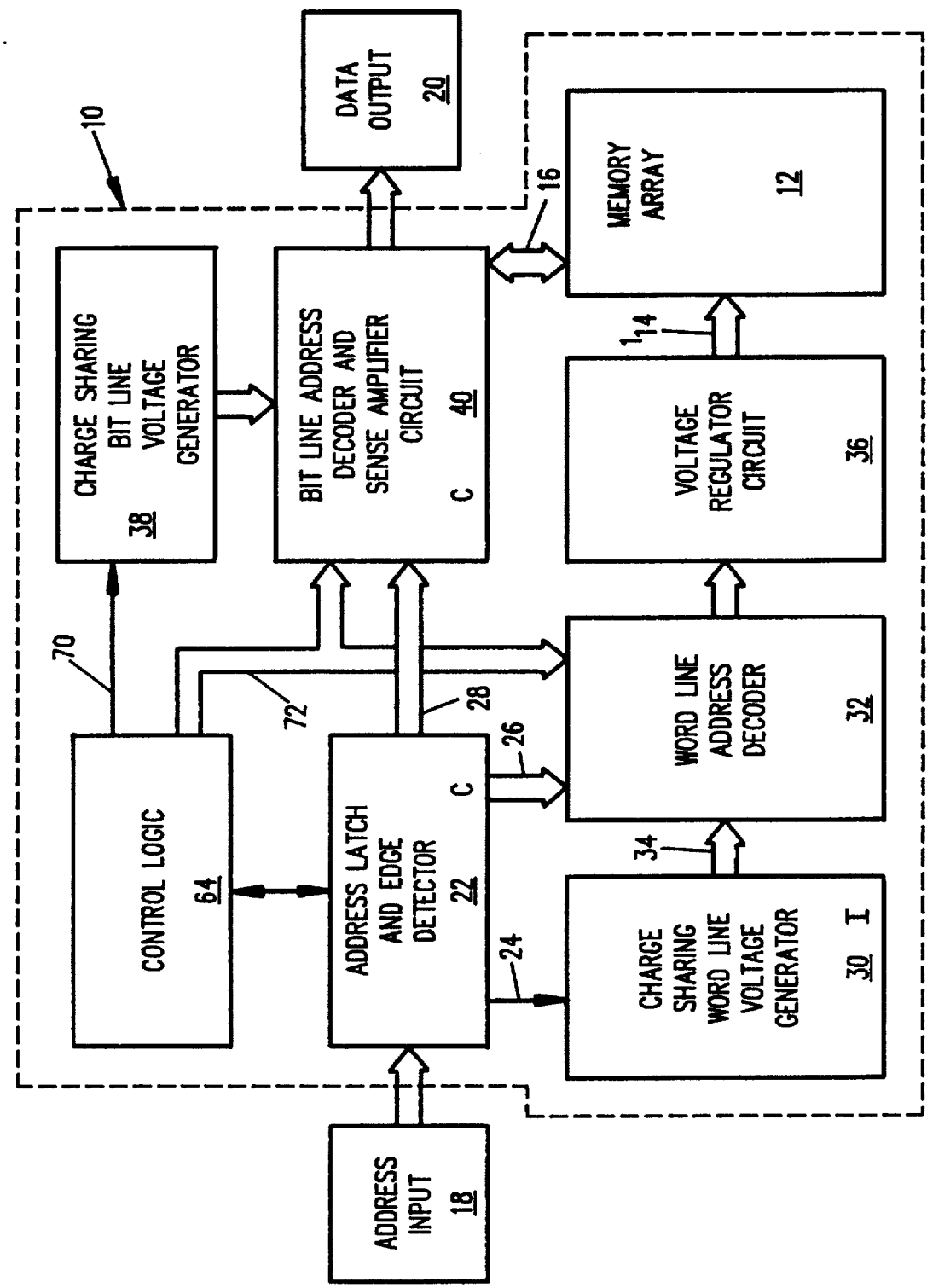
FIG. 2 is an illustrative block diagram of the architecture of the present invention.

Referring now to FIG. 2, shown is a block diagram of a Flash EEPROM 10 constructed in accordance with the present invention. The Flash EEPROM 10 will be considered as having a conventional 1 Megabit (128 k×8) memory array 12, comprised of 1024 rows by 1024 columns of memory cells (not shown). The rows of memory cells are accessible by way of word lines 14 and the columns of memory cells are accessible by way of bit lines 16. The memory array 12 is a conventional memory array used in 5

Flash EEPROMs; the Flash EEPROM 10, however, uses an input voltage of about 3 V (not shown).

It is important to note that the Flash EEPROM 10 described is a preferred embodiment of the present invention; the invention is not limited to this embodiment, but includes all applicable CMOS technology memory devices, including other configurations of Flash EEPROMs and EEPROMs. For the purposes of the patent, the term EEPROM includes all applicable CMOS technology memory devices.

During a read operation, address input 18 is provided to the EEPROM 10 to cause the EEPROM 10 to subsequently provide data output 20 that corresponds to the data stored in the memory array 12 at the provided address. For this embodiment, the Flash EEPROM 10 will use a 17-bit address input 18 (designated $A_0$ through $A_{16}$) to uniquely identify an 8 bit data output 20 (designated $D_O$ through $D_7$).

To perform a read operation, address input 18 is provided to the EEPROM 10 and received by a conventional address latch and edge detector 22. The address latch and edge detector 22 provides a changed address signal 24 when a new address is detected by the address latch and edge detector 22. The address latch and edge detector 22 also divides the address input 18 into word line address signals 26 and bit line address signals 28.

Word line address signals 26 are used to uniquely identify a selected row, or word line 14, in the memory array 12. Bit line address signals 28 are used to uniquely identify a selected 8-bit byte of memory cells along the selected bit line 16 in the memory array 12 by identifying a selected set of eight columns, or bit lines 16, in the memory array 12.

The changed address signal 24 is provided to a charge-sharing word line voltage generator 30 that, in response to the changed address signal 24, generates and stores a charge.

The address latch and edge detector 22, the charge-sharing word line voltage generator 30, and the input voltage connected to a word line address decoder 32. The word line address decoder 32 uses the word line address signals 26 from the address latch and edge detector 22 to select an individual word line 14 containing the eight memory cells to be read and deselect the remaining word lines 14. The word line address decoder 32 applies the input voltage to the selected word line and connects the charge-sharing word line voltage generator 30 to the deselected word lines 14. The charge stored by the charge-sharing word line voltage generator 30 is shared with the deselected word lines such that a voltage $V_{EE}$ 34, negative with respect to the input voltage, is applied to the deselected word lines 14. A voltage regulator circuit 36 regulates the voltages applied to the word lines 14.

A conventional bit line address decoder and sense amplifier circuit 40 is connected to the address latch and edge detector 22. The bit line address decoder and sense amplifier circuit 40 uses the bit line address signals 28 to select the eight columns in the memory array 12 containing the memory cells to be read, applies ground (0 V) to the associated source bit lines, and reads the memory cells.

In the preferred embodiment, the voltage applied to the selected word line is the input voltage $V_{cc}$, which is about 3 V. The voltage applied to the deselected word lines is the voltage $V_{EE}$ 34, which is about $-2$ V. This provides a gate voltage $V_{GS}$ of about 3 V for the memory cells to be read, providing sufficient voltage margin to reliably read the memory cells. In addition, the memory cells in the deselected word line rows sharing source bit lines with the memory cells to be read have a gate voltage $V_{GS}$ of about $-2$ V ensuring that these memory cells will not turn on and provide false data during the read operation.

Referring now to FIG. 2, shown is a schematic circuit diagram of one circuit out of a plurality of the circuits in the charge-sharing word line voltage generator 30. In the preferred embodiment, the charge-sharing word line voltage generator 30 has 64 of these circuits; only a single circuit is shown, however, to facilitate the present discussion.

Figure 3:
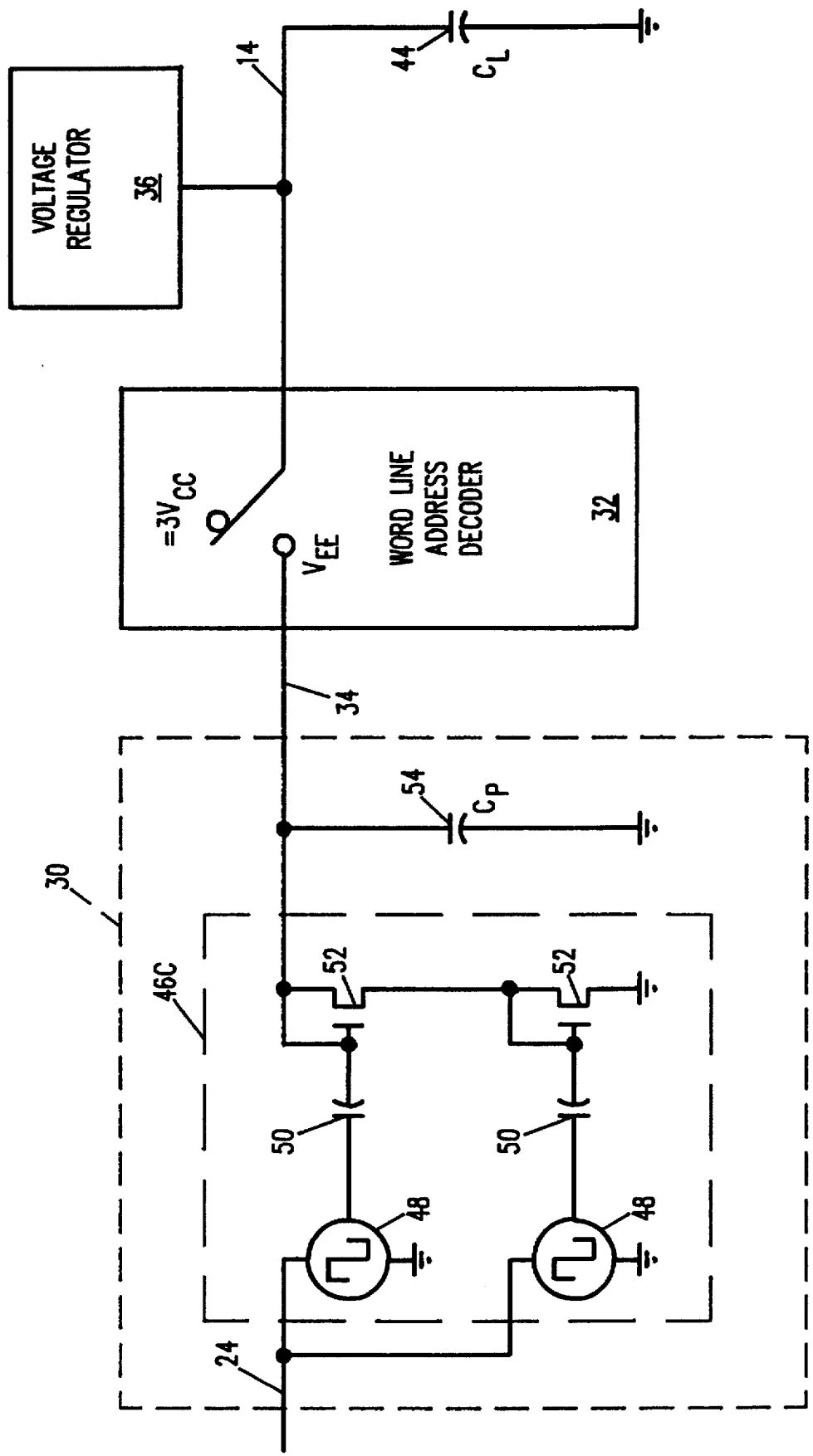
FIG. 3 is a schematic block diagram showing a charge-sharing word line voltage generator and associated circuitry of the present invention.

Also shown in FIG. 3 are representations of the word line address decoder 32, the voltage regulator circuit 36, a single word line 14, and a capacitor $C_L$ 44.

The charge-sharing word line voltage generator 30 shown in FIG. 2 has a conventional charge pump circuit 46 with square-wave oscillators 48, differentiating capacitors 50, and n-type CMOS field effect transistors 52. When the charge pump circuit 46 is enabled by the changed address signal 24, the oscillators 48 provide square wave outputs that are differentiated by the capacitors 50 into signals with positive and negative voltage spikes. The transistors 52 select the negative component of the differentiated signals, allowing the charging of capacitor $C_p$ 54, connected to the output of the charge pump circuit 46. Thus, during operation of the charge pump circuit 46, capacitor $C_p$ 54 is charged to a negative voltage.

As greatly simplified in FIG. 3, the capacitor $C_p$ 54 is shown to connect by way of a switch in the word line address decoder 32 to the capacitor $C_L$ 44. The capacitor $C_L$ 44 is the total equivalent capacitance of the load driven by capacitor $C_p$ 54, which in the present embodiment is the equivalent capacitance of about sixteen word lines 14 in the memory array 12.

The capacitor $C_p$ 54 makes use of a technique described as charge-sharing to provide the required voltage $V_{EE}$ 34 to the deselected word lines during a read operation. Charge-sharing is simply the sharing of the stored charge on capacitor $C_p$ 54 with the equivalent capacitor $C_L$ 44. After the capacitor $C_p$ 54 is precharged to an initial voltage, the switch in the word line address decoder 32 connects capacitor $C_p$ 54 and capacitor $C_L$ 44, so part of the charge on capacitor $C_p$ 54 is shared with the capacitor $C_L$ 44. This transfer of charge occurs very quickly, perhaps less than 1 ns.

In the preferred embodiment, the voltage $V_{EE}$ 34 applied to the deselected word lines during a read operation is about $-2$ V. To accomplish this, the capacitor $C_p$ 54 is sized to have about the same capacitance as equivalent capacitor $C_L$ 44 (about 500 pf). During operation of the charge pump circuit 46, capacitor $C_p$ 54 is charged to have an initial voltage of about $-4$ V. When the word line address decoder 32 connects the charge-sharing word line voltage generator 30 to the deselected word lines 14, the charge on capacitor $C_p$ 54 is shared with capacitor $C_L$ 44, resulting in about $-2$ V on both capacitors.

The charge-sharing technique improves the access time of the Flash EEPROM 10 by allowing the charge pump circuits 46 to begin operation as soon as a new address is detected. There is no delay caused by waiting for the word line address decoder 32 to identify where the voltage is to be applied. In addition, the charge pumps are normally in a non-operational, standby mode; the charge pumps only operate when a new address is detected. This significantly reduces the Flash EEPROM 10 power consumption.

Voltage controlled oscillators (VCOs) could be used as the square-wave oscillators 48 in the charge pump circuit 46. During standby mode, instead of turning off the VCOs, the EEPROM could reduce the VCO frequencies, perhaps by an order of magnitude, and continue to charge the capacitor $C_p$ 54. This would further reduce the EEPROM power consumption while potentially further decreasing the EEPROM read access time. Also, more than two square-wave oscillators 48 could be used.

Figure 4:
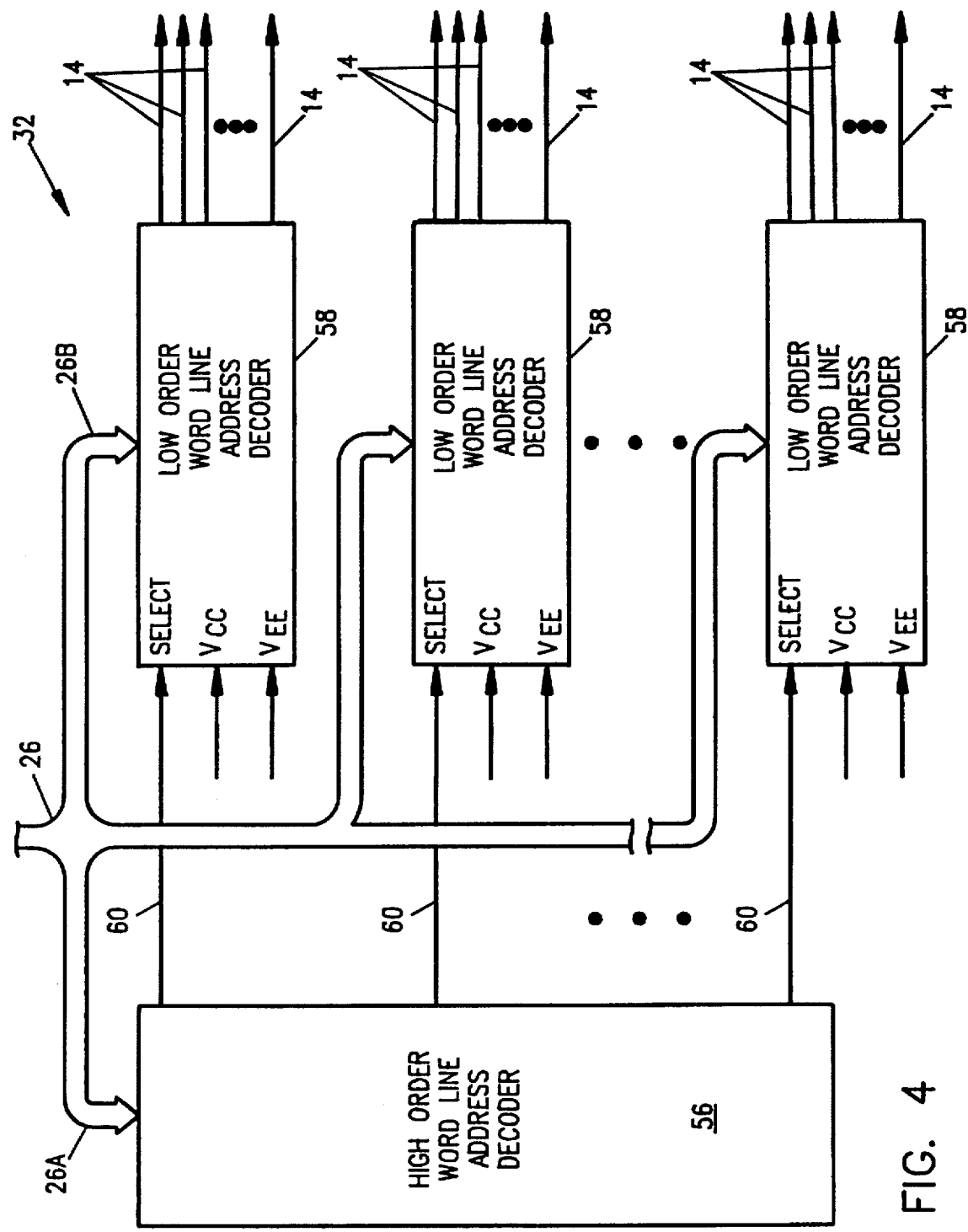
FIG. 4 is a block diagram showing a word line address decoder of the present invention.

Referring now to FIG. 4, shown is a schematic block diagram of the word line address decoder 32. In the preferred embodiment, the word line address decoder 32 is a conventional two-stage decoder having a high order word line address decoder 56 and a plurality of low order word line address decoders 58, with each low order word line address decoder 58 uniquely addressing 16 word lines 14 in the memory array 12.

A total of 64 low order word line address decoders 58 are required to uniquely address all 1024 word lines 14 in the memory array 12. Thus, the Flash EEPROM 10 has 64 low order word line address decoders 58 and a high order word line address decoder 56 to select among the 64 low order word line address decoders 58. A charge pump circuit 46 and capacitor $C_p$ 54, as shown in FIG. 2, are connected to each of the 64 low order word line address decoders 58 and provide the voltage $V_{EE}$ 34 inputs as shown.

To address 1024 word lines, a total of 10 address lines are required in the word line address signals 26 (as $2^{10}=1024$). Four out of the 10 address lines are used to provide low order addressing (because $2^4=16$), and the remaining six out of the 10 address lines are used to provide the high order addressing (because $2^6=64$).

During a read operation, word line address signals 26 are provided to the word line address decoder 32. The first six address lines from the word line address signals 26 provide high order address signals 26A to the high order word address line decoder 56. The high order address signals 26A enable the high order word address line decoder 56 to output a signal on select lines 60 to select the specific low order word line address decoder 58 containing the addressed word line 14.

The last four address lines from the word line address signals 26 provide low order address signals 26B to the low order word line address decoders 58. The low order word line address decoders 58 also receive the source voltage $V_{cc}$ and the voltage $V_{EE}$ 34.

Based on the word line address signals 26, the low order word line address decoders 58 select the addressed word line, deselect the remaining 1023 word lines, place the source voltage $V_{cc}$ on the selected word line and place voltage $V_{EE}$ 34 on the deselected word lines. Thus, at the completion of a word line address decoding operation, the selected word line receives a voltage of about 3 V and the deselected word lines receive a voltage of about −2 V.

Figure 1:
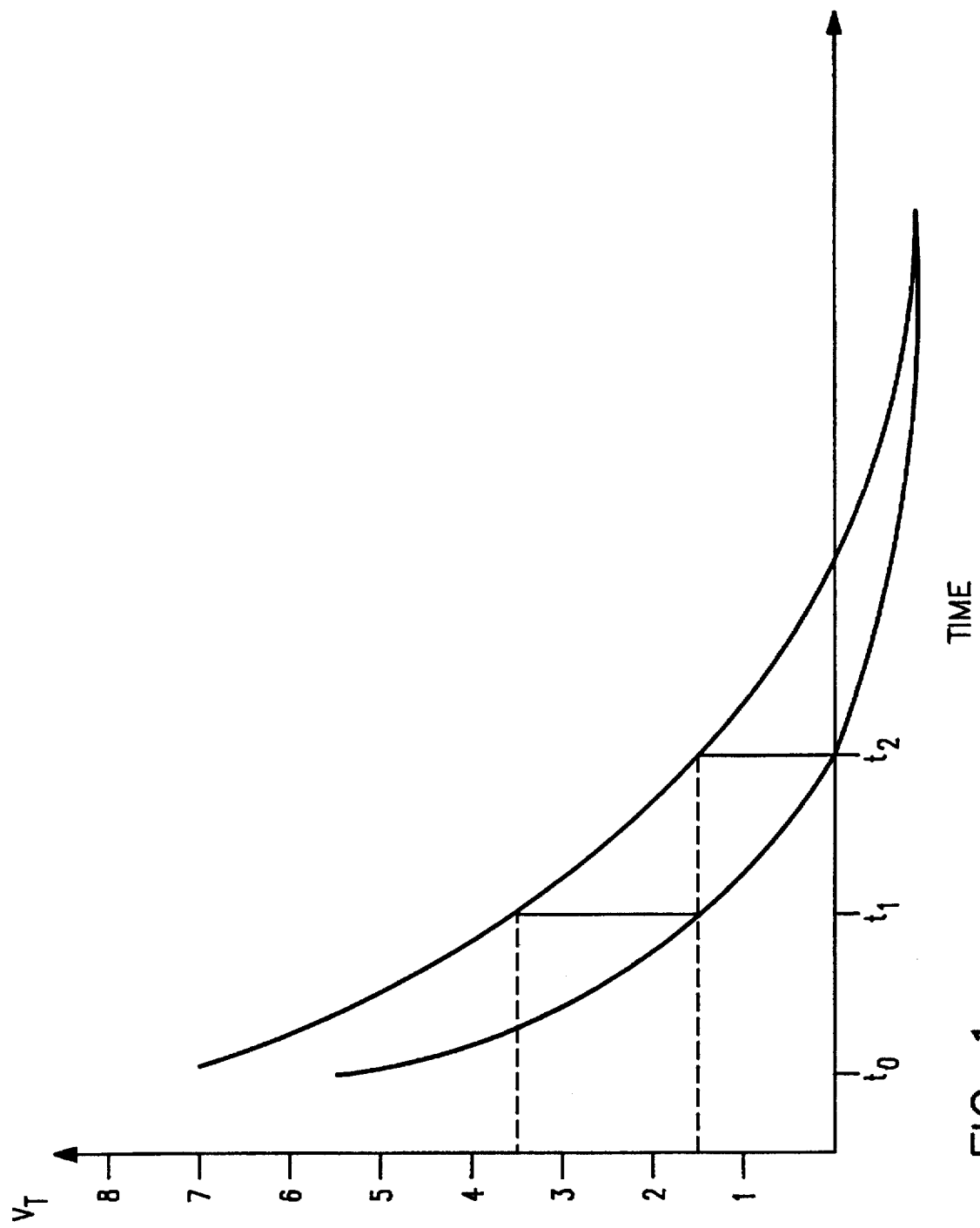
FIG. 1 is a graphical representation of the voltage threshold range of typical programmed memory cells as the memory cells are erased over time.

Each stage of decoding requires about 10 ns, so the total length of operation of the word line address decoder 32 is about 20 ns. This provides sufficient time for the 64 charge pump circuits 46 and capacitors $C_p$ 54, as described in FIG. 2, to generate and store the voltage $V_{EE}$ 34 to be used by the low order word line address decoders 58. It should be noted that the parallel operations of generating and storing the voltage $V_{EE}$ 34 by the charge-sharing word line voltage generator 30, as shown in FIG. 1, and decoding the word line address signals 26 by the word line address decoder 32, result in significantly improved access times over EEPROMs that perform these operations sequentially.

Increasing the number of charge pump circuits 46 and capacitors $C_p$ 54 may decrease the time required to generate and store a charge, but may lead to increased power consumption by an EEPROM; conversely, reducing the number of charge pump circuits 46 and capacitors $C_p$ 54 decreases an EEPROM's complexity and power consumption during read operations, but may also increase read access time.

Figure 5:
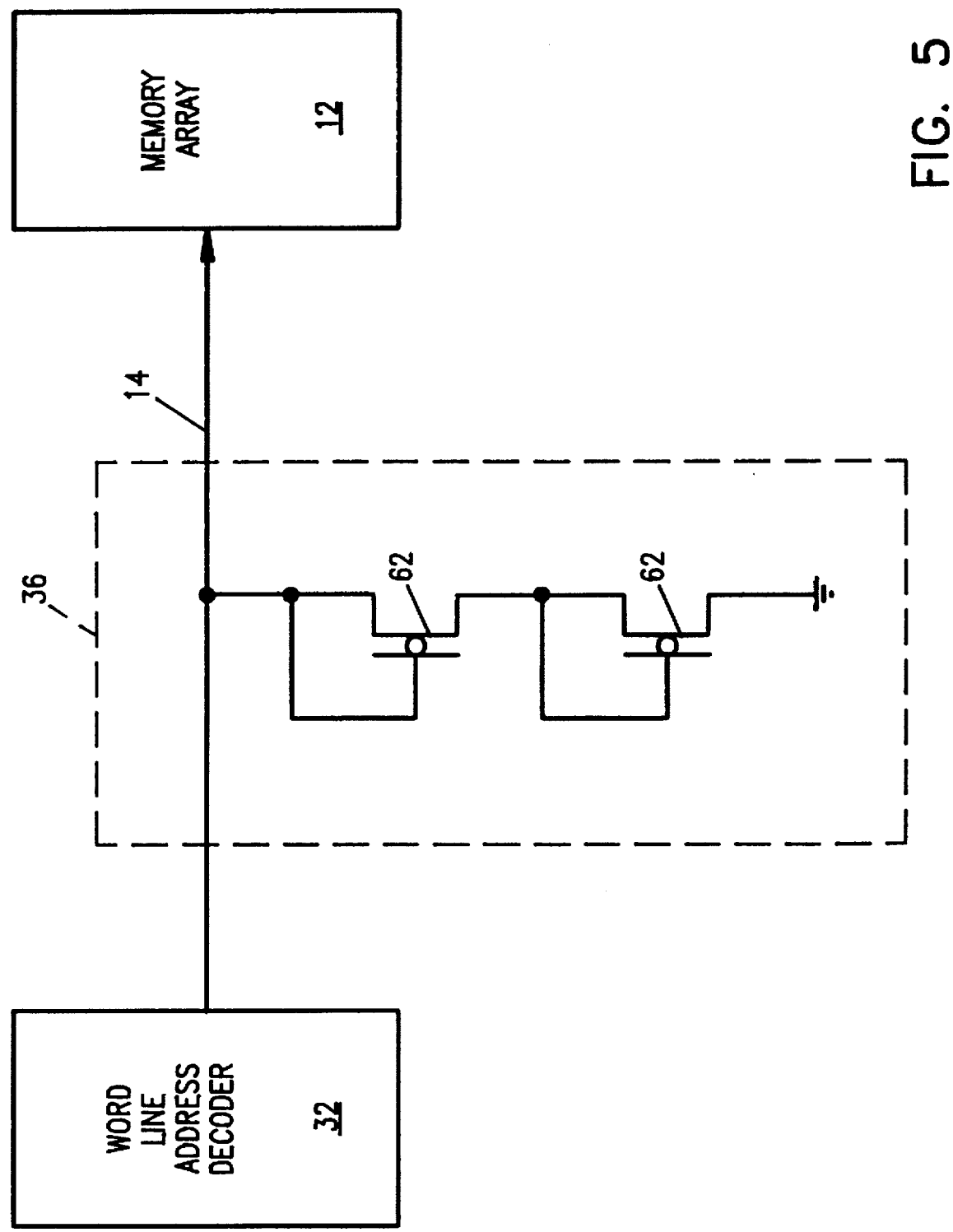
FIG. 5 is a schematic block diagram showing a word line voltage regulator circuit of the present invention.

Referring now to FIG. 5, shown is a schematic diagram of the voltage regulator circuit 36 that can be used to regulate the voltage applied to a single word line 14 by the word line address decoder 32, as shown in FIG. 3. Because one voltage regulator circuit 36 is needed for each word line 14, or a total of 1024 voltage regulator circuits 36 in the Flash EEPROM 10, each voltage regulator circuit 36 should occupy as little space as possible.

The voltage regulator circuit 36 of FIG. 5 has two p-type CMOS transistors 62, which takes advantage of the properties of p-type CMOS transistors 62; once these transistors 62 are in saturation, increased current flow will not significantly raise the voltage on the word line 14. Using two transistors 62, each with a voltage threshold $V_t$ of about 1 V, results in a space efficient word line voltage regulator circuit 36 capable of regulating a word line voltage to about −2 V.

It is important to note that read operations on the Flash EEPROM 10 are performed as previously described, but erase and write operations on the Flash EEPROM 10 are performed using generally conventional techniques.

In order to obtain an erased voltage threshold range of from about 0 V to about 1.5 V, however, the Flash EEPROM erase voltage may be increased slightly, from perhaps about 12 V to perhaps about 15 V, depending on the characteristics of the memory cells in the array 12. In some cases, the erase time may also be increased slightly, as necessary.

As is known by those of skill in the art, it is common to erase memory cells in an EEPROM by first programming the memory cells, erasing the memory cells, and then performing an erase verify operation. The erase verify operation determines that the erased voltage threshold range is below a maximum voltage level by applying the maximum voltage to the gates of the memory cells and reading the memory cells; if all the memory cells turn on, the erase was successful. Additional erase operations may be performed, as necessary, if the erase was unsuccessful.

To practice the preferred embodiment of the present invention, it is generally necessary that the maximum voltage have a value less than 3 V (and preferably about 1.5 V). Referring back to FIG. 1, erasing memory cells below a maximum voltage of about 1.5 V will generally result in an erased voltage threshold range of from about 0 V to about 1.5 V.

The previously referenced U.S. patent application Ser. No. 08/349,812 entitled APPARATUS AND METHOD FOR REDUCING ERASED THRESHOLD VOLTAGE DISTRIBUTION IN FLASH MEMORY ARRAYS describes a particularly useful method for adjusting an erased voltage threshold range by performing an additional erase verify step to determine whether the threshold range is below a minimum voltage. If so, the erased voltage threshold for memory cells below the minimum voltage are increased sufficiently to bring them into the required range.

The conditions imposed on the word lines and bit lines to perform read, write, and erase operations are shown in Table I. Voltages on additional lines, such as to a p-well and to an n-substrate, are conventional and therefore are not shown. "FLOAT" indicates the state does not matter.

TABLE I

| | Flash EEPROM Operation | | | |
|---|---|---|---|---|
| | READ | WRITE 0 | WRITE 1 | ERASE |
| Selected word line | 3 V | 12 V | 12 V | −12 to −15 V |
| Deselected word line | −2 V | GND | GND | 3 V |
| Selected source bit lines | GND | GND | GND | FLOAT |
| Selected drain bit line | 1 V | 6 V | 0 V | FLOAT |

It is not necessary to have the Flash EEPROM 10 generate the deselected word line voltage $V_{EE}$ 34 and the source bit line voltage $V_{FF}$ 42; these voltages could be externally supplied. For example, an EEPROM could be supplied with a source voltage of about 3 V and a second input voltage of about −3 V. The second input voltage of about −3 V could be used by the EEPROM to provide the deselected word line and the source bit line with the necessary voltages to perform a read operation. In addition, voltage divider circuitry could be used to divide an input voltage into values that could be used on the deselected word lines and the source bit lines, allowing a wide range of possibilities for different voltage inputs.

Furthermore, it is not necessary that the source voltage $V_{cc}$ be provided to the selected word line; for example, a low source voltage of perhaps 2 V could be positively charge pumped to provide a higher positive voltage for the selected word line. At the same time, the low source voltage could also be negatively charge pumped to provide voltages for the deselected word lines and source bit lines.

Using charge pump and charge-sharing techniques to provide voltages both greater than and less than the source voltage provides great flexibility in addressing variations in EEPROM voltage threshold ranges. The charge pump and charge sharing techniques allow the erased voltage threshold range to be moved as desired to provide optimum performance; this is not possible with conventional EEPROMS. Compensation circuitry can be used to control the voltages applied to the EEPROM memory array to compensate for variations during manufacturing, as well as changes in voltage threshold ranges due to the effects of temperature, voltage, and repeated usage, including erase operations.

The above description makes clear that the present invention is well adapted to carry out the objects and to attain the ends and advantages mentioned herein, as well as those inherent in the invention. While presently preferred embodiments of the invention have been described for purposes of this disclosure, numerous changes may be made which will readily suggest themselves to those skilled in the art and which are encompassed within the spirit of the invention disclosed and as defined in the claims.

What is claimed is:

1. An Electrically-Erasable Programmable Read-Only Memory (EEPROM) comprising:

an array of memory cells having a plurality of word lines and a plurality of bit lines;

an address latch and edge detector that outputs a changed address signal, word line address signals, and bit line address signals each time a new input address is received, each new input address indicating a corresponding selected memory cell to be read;

a charge sharing word line voltage generator that outputs a plurality of deselected voltages each time the changed address signal is received a predetermined time after the changed address signal is received; and a word line address decoder that identifies a selected word line and a plurality of deselected word lines from the plurality of word lines in response to the word line address signals, applies an input voltage to the selected word line after the selected word line is identified, forms a plurality of word line voltages in response to the deselected voltages, and applies each of the plurality of word line voltages to a corresponding one of the deselected word lines.

2. The EEPROM of claim 1 wherein each deselected voltage is negative with respect to ground.

3. The EEPROM of claim 1 wherein the charge sharing word line voltage generator includes:

a plurality of charge pumps that output the plurality of deselected voltages such that each charge pump outputs one deselected voltage; and a plurality of first capacitors that each store one of the deselected voltages.

4. The apparatus of claim 3 wherein the word line address decoder includes:

a plurality of switches arranged such that each switch is connected to one first capacitor; and a plurality of second capacitors arranged such that each second capacitor is connected to one switch and one of the plurality of word lines of the array, wherein when the word line address decoder identifies a deselected word line, the word line address decoder closes the switch associated with that deselected word line to electrically connect the second capacitor to the first capacitor that are associated with that deselected word line, thereby forming the word line voltage for that deselected word line.

5. An Electrically-Erasable Programmable Read-Only Memory (EEPROM) comprising:

a voltage source input for receiving a source voltage;

an array of memory cells having a plurality of word lines and a plurality of bit lines;

a plurality of address input lines for receiving address input indicating a selected memory cell to be read;

an address latch and edge detector, connected to the address input lines, for outputting word line address signals and bit line address signals;

a word line voltage generator for generating a word line voltage;

a word line address decoder, connected to the address latch and edge detector and the word line voltage generator, for receiving and decoding the word line address signals, selecting a word line, deselecting other word lines and applying the word line voltage to the deselected word lines;

a bit line address decoder and sense amplifier circuit, connected to the address latch and edge detector, for receiving and decoding the bit line address signals, identifying a selected bit line, reading the memory cell to be read and generating a data output; and a word line voltage regulator for regulating the word line voltage.

6. The EEPROM of claim 5 wherein the word line voltage is negative with respect to ground.

7. The EEPROM of claim 5 wherein the word line voltage generator comprises:

a plurality of charge pumps for generating the word line voltage; and plurality of capacitors for storing the word line voltage.

8. The EEPROM of claim 5 wherein the word line address signals comprise high order word line address signals and low order line address signals.

9. The EEPROM of claim 8 wherein the word line decoder comprises:

a high order word line decoder, connected to the address latch and edge detector, for receiving the high order word line address signals and generating a high order word line decoder signal; and a plurality of low order word line decoders, connected to the address latch and edge detector, to the high order word line decoder and to the word line voltage generator, for receiving the low order word line address signals, receiving the high order word line decoder signal, selecting the word line, deselecting other word lines, and applying the voltage from the word line voltage generator to the deselected word lines.

10. The EEPROM of claim 5 wherein the plurality of bit line comprises a plurality of source bit lines and a plurality of drain bit lines.

11. The EEPROM of claim 10 wherein the bit line address decoder and sense amplifier circuit reads the memory cell to be read by grounding the source bit line, applying a read voltage to the drain bit line and sensing the drain to source current.

12. An Electrically-Erasable Programmable Read-Only Memory (EEPROM) comprising:

a voltage source input for receiving a source voltage;

an array of memory cells having a plurality of word lines and a plurality of bit lines, the bit lines comprising a plurality of source bit lines and a plurality of drain bit lines;

a plurality of address input lines for receiving address input indicating a selected memory cell to be read;

an address latch and edge detector, connected to the address input lines, having a changed address signal, a word line address signal and bit line address signals;

a word line voltage generator, connected to the address latch and edge detector, for receiving the changed address signal and generating a word line voltage in response to the changed address signal, wherein the word line voltage is negative with respect to ground;

a word line address decoder, connected to the address latch and edge detector and to the word line voltage generator, for receiving and decoding the word line address signals, selecting a word line, deselecting other word lines and applying the word line voltage to the deselected word lines; and a bit line address decoder and sense amplifier circuit, connected to the bit line voltage generator and to the address latch and edge detector, for receiving and decoding the bit line address signals, applying the bit line voltage to the bit lines, reading the memory cell to be read and generating a data output.

13. The apparatus of claim 12 further comprising a word line voltage regulator for regulating the word line voltage.

14. The apparatus of claim 12 wherein the word line voltage generator generates the word line voltage before the line address decoder completes decoding of the word line address signals.

15. The EEPROM of claim 12 wherein the word line voltage generator comprises:

a plurality of charge pumps for generating a voltage; and a plurality of capacitors for storing the voltage.

16. The EEPROM of claim 15 wherein the word line address signals comprise high order word line address signals and low order word line address signals.

17. The EEPROM of claim 16 wherein the word line decoder comprises:

a high order word line decoder, connected to the address latch and edge detector, for receiving the high order word line address signals and generating a high order word line decoder signal; and a plurality of low order word line decoders, connected to the address latch and edge detector, the high order word line decoder and the voltage generator, for receiving the low order word line address signals, receiving the high order word line decoder signal, selecting the word line, deselecting other word lines, and applying the voltage from the word line voltage generator to the deselected word lines.

18. The EEPROM of claim 17 wherein the plurality of bit lines comprises a plurality of source bit lines and a plurality of drain bit lines.

19. The EEPROM of claim 18 wherein the bit line address decoder and sense amplifier circuit reads the memory cell to be read by grounding the source bit line, applying a red voltage to the drain bit line and sensing the drain to source current.

20. An Electrically-Erasable Programmable Read-Only Memory (EEPROM) comprising:

a voltage input for receiving a source voltage;

an array of memory cells having a plurality of word lines and a plurality of bit lines;

a plurality of address input lines for receiving address input indicating a selected memory cell to be read;

an address latch and edge detector, connected to the address input lines, having word line address signals and bit line address signals;

a word line voltage generator for generating a word line voltage;

a word line address decoder, connected to the address latch and edge detector and connected between the word line voltage generator and the memory array, for receiving and decoding the word line address signals, selecting a word line and applying the word line voltage to the selected word line; and a bit line address decoder and sense amplifier circuit, connected to the address latch and edge detector, for receiving the bit line address signals, reading the memory cell to be read and generating a data output.

21. The EEPROM of claim 20 wherein the word line voltage is positive with respect to the source voltage.

22. The EEPROM of claim 21 wherein the word line voltage generator comprises:

a charge pump for generating a word line voltage; and a capacitor for storing the word line voltage.

23. The EEPROM of claim 20 wherein the address latch and edge detector has a changed address signal, and wherein the word line voltage generator is connected to the address latch and edge detector, receives the changed address signal, and generates the word line voltage in response to the changed address signal.

24. A method of reading an EEPROM memory cell comprising:

generating a changed address signal, word line address signals and bit line address signals each time a new input address is received, each new input address indicating a selected memory cell to be read;

generating a word line voltage in response to the changed address signal, wherein the word line voltage is negative with respect to the ground;

receiving and decoding the word line address signals to identify a selected word line and a plurality of deselected word lines, wherein the memory cell to be read is within the selected word line; and applying the word line voltage to the deselected word lines.

25. The method of claim 24 wherein the step of generating a word line voltage is completed before completion of decoding of the word line address signals.

26. A method of reading a memory cell within an array of memory cells having a plurality of word lines and a plurality of bit lines on an Electrically-Erasable Programmable Read-Only Memory, comprising:

outputting a changed address signal, word line address signals, and bit line address signals each time a new input address is received, each new input address indicating a selected memory cell to be read;

outputting a plurality of deselected voltages each time the changed address signal is output a predetermined time after the changed address signal is output;

identifying a selected word line and a plurality of deselected word lines in response to the word line address signals;

applying an input voltage to the selected word line after the selected word line is identified;

forming a plurality of word line voltages in response to the deselected voltages; and applying each word line voltage to one deselected word line.

27. A method of reading an EEPROM memory cell comprising:

generating a changed address signal, word line address signals and bit line address signals each time a new input address is received, each new input address indicating a selected memory cell to be read;

generating a deselected voltage in response to the changed address signal by charge pumping an initial voltage to form the deselected voltage, and by storing the deselected voltage, wherein the deselected voltage is negative with respect to the ground;

receiving and decoding the word line address signals to identify a selected word line and a plurality of deselected word lines, wherein the memory cell to be read is within the selected word line;

forming a word line voltage in response to the deselected voltage; and applying the word line voltage to the deselected word lines, wherein the step of generating a word line voltage is completed before completion of decoding of the word line address signals.

28. The method of claim 27 and further comprising the step of applying an input voltage to the selected word line.

29. The method of claim 27 wherein the word line address signals comprise:

a high order word line address signals; and low order word line address signals.

30. The method of claim 29 wherein the step of receiving and decoding the word line address signals and decoding the word line address comprises:

receiving and decoding the high order word line address signals;

receiving and decoding the low order word line address signals;

selecting a word line, wherein the memory cell to be read is within the selected word line; and deselecting the other word lines.

* * * * *

UNITED STATES PATENT AND TRADEMARK OFFICE
CERTIFICATE OF CORRECTION

PATENT NO. : 5,537,362
DATED : July 16, 1996
INVENTOR(S) : Manzur Gill et al.

It is certified that error appears in the above-indentified patent and that said Letters Patent is hereby corrected as shown below:

In Col. 11, line 20, delete "line" and replace with --lines--.

Signed and Sealed this

First Day of October, 1996

Attest:

BRUCE LEHMAN

Attesting Officer

Commissioner of Patents and Trademarks